(12) United States Patent
Schrama et al.

(10) Patent No.: US 11,971,559 B2
(45) Date of Patent: Apr. 30, 2024

(54) STEREOSCOPIC DISPLAY USING microLED TECHNOLOGY

(71) Applicant: Lumileds LLC, San Jose, CA (US)

(72) Inventors: Charles André Schrama, San Jose, CA (US); Erno Fancsali, Heusden-Zolder (BE)

(73) Assignee: Lumileds LLC, San Jose, CA (US)

( * ) Notice: Subject to any disclaimer, the term of this patent is extended or adjusted under 35 U.S.C. 154(b) by 3 days.

(21) Appl. No.: 18/083,900

(22) Filed: Dec. 19, 2022

(65) Prior Publication Data

US 2023/0185108 A1 Jun. 15, 2023

Related U.S. Application Data

(63) Continuation of application No. 17/129,529, filed on Dec. 21, 2020, now Pat. No. 11,531,213.

(60) Provisional application No. 62/953,323, filed on Dec. 24, 2019.

(51) Int. Cl.
| | | |
|---|---|---|
| *G02B 30/30* | (2020.01) | |
| *G02B 30/33* | (2020.01) | |
| *G09G 3/32* | (2016.01) | |
| *H01L 25/075* | (2006.01) | |
| *H01L 33/58* | (2010.01) | |
| *H04N 13/302* | (2018.01) | |

(52) U.S. Cl.
CPC .............. *G02B 30/33* (2020.01); *G09G 3/32* (2013.01); *H01L 25/0753* (2013.01); *H01L 33/58* (2013.01); *H04N 13/302* (2018.05); *G09G 2300/0452* (2013.01); *G09G 2320/0626* (2013.01); *G09G 2320/068* (2013.01)

(58) Field of Classification Search
CPC ............ G02B 27/01–017; G02B 30/33; H01L 25/0753; H01L 33/58; G09G 3/32; G09G 2300/0452; G09G 2320/068; H04N 13/302

See application file for complete search history.

(56) References Cited

U.S. PATENT DOCUMENTS

| | | |
|---|---|---|
| 5,640,171 A | 6/1997 | Shimada |
| 11,531,213 B2 | 12/2022 | Schrama et al. |

(Continued)

OTHER PUBLICATIONS

U.S. Appl. No. 17/129,529 U.S. Pat. No. 11,531,213, filed Dec. 21, 2020, Stereoscopic Display Using Microled Technology.

(Continued)

*Primary Examiner* — Roy P Rabindranath
(74) *Attorney, Agent, or Firm* — Schwegman, Lundberg & Woessner, P.A.

(57) ABSTRACT

An apparatus and method for displaying an image are disclosed. The apparatus includes independently-controllable microLED unit cells including sets of microLEDs each emitting light and at least one lens to control an emission angle and emission profile of the light emitted by the microLED unit cells. A display controller controls an intensity distribution of the microLED unit cells in accordance with a video data signal such that a first portion of the emitted light is emitted at a first emission angle with a first emission profile and a second portion of the emitted light is emitted at a second emission angle with a second emission profile. The first and second light portions form three-dimensional stereoscopic images.

24 Claims, 11 Drawing Sheets

(56) References Cited

U.S. PATENT DOCUMENTS

| | | | |
|---|---|---|---|
| 2006/0152523 A1* | 7/2006 | Tomita | G02B 30/25 |
| | | | 345/589 |
| 2014/0264407 A1 | 9/2014 | Tischler et al. | |
| 2018/0150201 A1* | 5/2018 | Kakinuma | G06F 3/04883 |
| 2019/0243149 A1* | 8/2019 | Iguchi | H01L 25/0753 |
| 2021/0191145 A1 | 6/2021 | Schrama et al. | |
| 2021/0223568 A1* | 7/2021 | Makinen | H04N 13/31 |
| 2021/0243419 A1* | 8/2021 | Kusafuka | H04N 13/383 |
| 2022/0350139 A1* | 11/2022 | Tsuda | G09G 3/002 |
| 2023/0011407 A1* | 1/2023 | Lee | G02B 27/01 |

OTHER PUBLICATIONS

"U.S. Appl. No. 17/129,529, 312 Amendment filed Oct. 24, 22", 7 pgs.
"U.S. Appl. No. 17/129,529, Corrected Notice of Allowability dated Aug. 12,20 22", 4 pgs.
"U.S. Appl. No. 17/129,529, Examiner Interview Summary dated Jul. 14, 2022", 2 pgs.
"U.S. Appl. No. 17/129,529, Final Office Action dated May 16, 2022", 17 pgs.
"U.S. Appl. No. 17/129,529, Non Final Office Action dated Dec. 7, 2021", 17 pgs.
"U.S. Appl. No. 17/129,529, Notice of Allowance dated Aug. 3, 2022", 11 pgs.
"U.S. Appl. No. 17/129,529, PTO Response to Rule 312 Communication dated Nov. 9, 2022", 2 pgs.
"U.S. Appl. No. 17/129,529, Response filed Mar. 7, 2022 to Non Final Office Action dated Dec. 7, 2021", 11 pgs.
"U.S. Appl. No. 17/129,529, Response filed Jul. 11, 2022 to Final Office Action dated May 16, 2022", 10 pgs.

* cited by examiner

STEREOSCOPIC DISPLAY USING microLED TECHNOLOGY

PRIORITY

This application is a continuation of U.S. patent application Ser. No. 17/129,529, filed on Dec. 21, 2020, which claims the benefit of priority to U.S. Provisional Patent Application Ser. No. 62/953,323, filed Dec. 24, 2019, which are incorporated herein by reference in their entireties.

TECHNICAL FIELD

The present disclosure relates generally to displays and, more specifically, to a stereoscopic display using microLED technology.

BACKGROUND

MicroLED is an emerging display technology that employs arrays of microscopic LEDs to implement the individual pixels of the display. Compared to LCD displays, microLED displays offer improved contrast, response times, and energy efficiency. OLED and microLED displays may be advantageously used to implement small, low-energy devices, such as smartwatches and smartphones, for example. OLED and microLED technology both offer greatly reduced energy requirements compared to conventional LCD displays while simultaneously offering a high contrast ratio. Unlike OLED, microLED can be based on indium gallium nitride (InGaN) and/or aluminum indium gallium phosphide (AlInGaP) LED technology, which offers a far greater (e.g., up to 30 times greater) total brightness than OLED, as well as higher efficiency (which may be expressed in cd/W, c/A, nits/W, or nits/A) and lower power consumption than OLED. Unlike microLED, OLED also suffers from screen burn-in.

Stereoscopy creates for a viewer the illusion of three-dimensional depth from two-dimensional images. Human vision, including depth perception of depth, is a complex process that begins with the acquisition of raw visual information through the eyes followed by complex processing in the brain to make sense of the acquired information. One of the processes that occurs within the brain is assessing the relative distance of an object from the viewer and the depth dimension of that object. The brain uses various cues to gauge relative distance and depth, including, among others, stereopsis and accommodation of the eye.

Stereoscopy is the production of the illusion of depth in a two-dimensional image through the presentation of a slightly different version of the image to each eye of the viewer, resulting in stereopsis. The brain combines the two images to create the perception of depth. Stereoscopic technology is also conventionally (if somewhat erroneously) referred to as three-dimensional, or 3D, technology.

Stereoscopic technology and cinema have a long history, with the earliest stereoscopic projects dating back to the 1800s. Most stereoscopic technologies rely on the use of glasses, or spectacles, that ensure that each eye of a user perceives a slightly different image, which are processed by the brain to create stereoscopic vision. In contrast, autostereoscopy, high resolution 3D ("HR3D"), and multiscopy are technologies that allow stereoscopic vision without glasses. The technologies create slightly different pictures based on viewing angle.

BRIEF DESCRIPTION OF THE FIGURES

To provide a more complete understanding of the present disclosure and features and advantages thereof, reference is made to the following description, taken in conjunction with the accompanying figures, wherein like reference numerals represent like parts, in which.

DETAILED DESCRIPTION

Figure 1A:
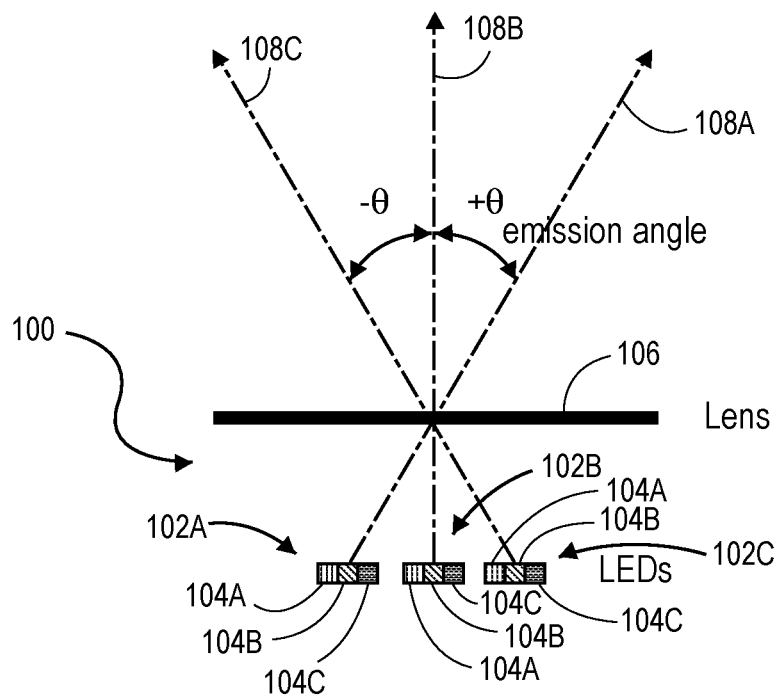
FIG. 1A illustrates a unit cell for representing a pixel in a stereoscopic display implemented using microLEDs in accordance with embodiments described herein.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating the disclosures described herein, it might be useful to understand phenomena that may be relevant to various embodiments thereof. The following foundational information may be viewed as a basis from which the present disclosure may be properly explained. Such information is offered for purposes of explanation only and, accordingly, should not be construed in any way to limit the broad scope of the present disclosure and its potential applications.

Some embodiments provide an apparatus for displaying an image on a display. The apparatus includes a plurality of microLED unit cells, wherein each of the microLED unit cells emits light of a tunable color and intensity. Each of the microLED unit cells comprises a plurality of sets of microLEDs and at least one lens positioned over the plurality of sets of microLEDs for controlling an emission angle and emission profile of the light emitted by the microLED unit cells. The apparatus further includes a display controller for controlling an intensity distribution of each of the microLED unit cells in accordance with at least one video data signal such that a first portion of the light emitted by each of the microLED unit cells is emitted at a first emission angle and emission profile directed toward a first eye of a viewer and a second portion of the light emitted by each of the microLED unit cells is emitted at a second emission angle and emission profile directed toward a second eye of the viewer and wherein the first and second light portions comprise stereoscopic images perceived by the viewer as a three-dimensional image. Each of the microLED unit cells corresponds to a pixel of the display.

Other embodiments provide a method for presenting an image on a display, the method including providing a plurality of microLED unit cells, wherein each of the microLED unit cells emits light of a tunable color and intensity and wherein each of the microLED unit cells comprises a plurality of sets of microLEDs, and controlling an emission angle and emission profile of the light emitted by each of the microLED unit cells. The method further includes controlling an intensity distribution of the light emitted by each of the microLEDs unit cells in accordance with at least one video data signal such that a first portion of the light emitted by each of the microLED unit cells is emitted at a first emission angle and emission profile directed toward a first eye of a viewer and a second portion of the light emitted by each of the microLED unit cells is emitted at a second emission angle and emission profile directed toward a second eye of the viewer and wherein the first and second light portions comprise stereoscopic images perceived by the viewer as a three-dimensional image.

Still other embodiments provide an apparatus for displaying an image on a display including a plurality of microLED unit cells, wherein each of the microLED unit cells emits light of a tunable color and intensity, wherein each of the microLED unit cells comprises at least one set of microLEDs and corresponds to a pixel of the display, and at least one lens for controlling an emission angle and emission profile of the light emitted by each of the microLED unit cells, wherein the at least one lens is integrated into the microLED unit cell and positioned over the at least one set of microLEDs. The apparatus further includes a display controller for controlling an intensity distribution of each of the microLED unit cells in accordance with at least one video data signal such that a first portion of the light emitted by each of the microLED unit cells is emitted at a first emission angle and emission profile directed toward a first eye of a viewer and a second portion of the light emitted by each of the microLED unit cells is emitted at a second emission angle and emission profile directed toward a second eye of the viewer and wherein the first and second light portions comprise stereoscopic images perceived by the viewer as a three-dimensional image.

Embodiments disclosed herein may provide an energy efficient, high contrast, highly responsive stereoscopic display that does not require a viewer to use glasses, spectacles, or other additional equipment. Other features and advantages of the disclosure will be apparent from the following description and the claims.

As will be appreciated by one skilled in the art, aspects of the present disclosure, in particular aspects of a microLED stereoscopic display described herein may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing stereoscopic display systems and/or their controllers, etc.) or be stored upon manufacturing of these devices and systems.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, showing, by way of illustration, some of the embodiments that may be practiced. In the drawings, same reference numerals refer to the same or analogous elements/materials so that, unless stated otherwise, explanations of an element/material with a given reference numeral provided in context of one of the drawings are applicable to other drawings where elements/materials with the same reference numerals may be illustrated. For convenience, if a collection of drawings designated with different letters are present, e.g., FIGS. 2A-2C, such a collection may be referred to herein without the letters, e.g., as "FIG. 2." The accompanying drawings are not necessarily drawn to scale. Moreover, it will be understood that certain embodiments can include more elements than illustrated in a drawing, certain embodiments can include a subset of the elements illustrated in a drawing, and certain embodiments can incorporate any suitable combination of features from two or more drawings.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

In some examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the accompanying drawings may be combined in various possible configurations, all of which are clearly within the broad scope of the present disclosure. In certain cases, it may be easier to describe one or more of the functionalities of a given set of flows by only referencing a limited number of electrical elements.

The following detailed description presents various descriptions of specific certain embodiments. However, is to be understood that other embodiments may be utilized, and structural or logical changes may be made without departing from the scope of the present disclosure. In general, the innovations described herein can be embodied in a multitude of different ways, for example, as defined and covered by the claims and/or select examples, and the following detailed description is not to be taken in a limiting sense.

As will be described in greater detail hereinbelow, some examples provide a unit cell having several LEDs (in particular, microLEDs), each of which may be addressed individually or in groups. In one embodiment, microLEDS can be sized to be significantly smaller than a lens positioned to receive light from the microLEDs and use of a protective encapsulation layer may be avoided. Multiple microLEDS can be positioned under the same lens, with at least some microLEDS being positioned away from an optical axis of the lens. Depending on their position with respect to the lens, each light beam emitted from the microLEDS will typically have a slightly differing beam direction. In this case, the microLEDS associated with a particular lens may be individually controlled to allow different images to be presented at different viewing angles, as described in more detail below. Alternatively, microLEDS can fitted with similarly sized integral lens and differing beam directions can be provided by modifications to lens characteristics or direction of microLED light emission, again allowing different images to be presented at different viewing angles. The microLEDs can be independently activated (or turned on), deactivated (or turned off), or "dimmed" to an intermediate value. These features enable the beam or beams emitted from the unit cells to appear to be steered without physically moving either the microLEDS or the lens. In addition to beam steering, beam intensity can be increased or decreased by increasing or decreasing the number of microLEDs used to form a beam. This allows for highlighting a location or turned down to reduce or eliminate light where the light is not desired. Beam steering can save energy by only generating the light to be used. In some embodiments, complex dynamic lighting effects based on beam steering can be created and may be used for directing user attention or for artistic effect.

FIG. 1A illustrates a unit cell 100 of a microLED array for representing a pixel in a stereoscopic display implemented using microLEDs in accordance with embodiments described herein. As used herein, the term "microLED" can refer to microscopic III-V semiconductor or other compound semiconductor light emitters, such as indium gallium nitride (InGaN)-based and/or aluminum indium gallium phosphide (AlInGaP)-based LEDs. Some microLED embodiments do not use an encapsulation layer and can be sized on the order of $1/100^{th}$ the size of conventional LEDs. The term "microLED display" refers to an emissive display implemented using arrays of microLEDs in which the picture elements, or pixels, are also the light source. Emissive display technologies do not require a separate backlight layer, enabling them to be thinner than LCDs. In various embodiments, the display may be implemented as a monolithic die display, a segmented display, and/or a pixelated display. A microLED array may include a plurality of pixels arranged as a matrix. Thus, microLEDs can be defined on a monolithic semiconductor substrate, formed on segmented, partially, or fully divided semiconductor substrate, or individually formed or panel assembled as groupings of microLEDs. The microLED array may comprise independently operable discrete microLEDs arranged as an array or one or more segmented monolithic microLED array in which the segments may be independently operable. A segmented monolithic microLED array is a monolithic semiconductor diode structure in which trenches passing partially but not entirely through the semiconductor diode structure define electrically isolated segments. The electrically isolated segments remain physically connected to each other by portions of the semiconductor structure.

In some embodiments, the light emitting array can include small numbers of microLEDs positioned on substrates that are centimeter scale area or greater. In some embodiments, the plurality of pixels may be arranged in regular shape, such as a rectangle or circle, although other shapes may be used. Pixels can be of the same size, of differing sizes, or similarly sized and grouped to present larger effective pixel size. The microLED array may include thousands or millions of light emitting LEDs positioned together on centimeter scale area substrates or smaller. Each pixel may comprise a microLED as described herein. The microLED array can support high density pixels having a lateral dimension of less than about 100 μm by 100 μm. As used herein, a microLED refers to an independently-controllable LED. Alternatively, or in addition, a microLED refers to an LED having lateral dimensions of about 1 to about 100 μm. For example, a microLED array may have lateral dimensions of about 50 μm in diameter or width. Note that although a stereoscopic display is described specifically, any set of related images may be used.

As shown in FIG. 1A, in the illustrated embodiment, a unit cell 100 (which may also be referred to as a "hyperpixel") includes a number of sets of microLEDs 102A-102C each of which includes a number of microLEDs 104A-104C, each of which emits a different color. The microLED array may contain a number of hyperpixels. For example, one microLED of each set (e.g., microLEDs 104A) may emit red light, while another microLED of each set (e.g., microLEDs 104B) may emit green light and the remaining microLED of each set (e.g., microLEDs 104C) may emit blue light. Although as illustrated in FIG. 1A, the unit cell 100 includes three sets of microLEDs, it will be recognized that more or fewer sets may be deployed without departing from the spirit of embodiments described herein. Similarly, while each set of microLEDs is shown as including three microLEDs that emit red, blue, and green light, it will be recognized that each set may include greater or fewer than three microLEDs and that each LED of a set may emit a color other than red, blue, or green, such as saturated colors. Additionally, the order of LED colors may be different than as represented in FIG. 1A.

Referring again to FIG. 1A, the unit cell 100 can include a lens 106 positioned over the sets of microLEDs 102A-102C. As will be understood, a single lens or multiple lens system can be used. In some embodiments the lens 106 can be integrally attached to the microLEDS 102A-102C, while in other embodiments the lens can be positioned in a fixed distance from the microLEDs 102A-102C. Position, shape, and optical characteristics of lens 106 determine directions in which a beam of light is emitted from each set of microLEDs, as represented by a respective arrow 108A-108C (which beams collectively comprise an emission pattern). In other words, the lens 106 is appropriately configured to direct the beam emitted from each of the sets of microLEDs in the direction indicated by the respective arrow. For example, assuming the angle of the beam emitted from microLED set 102B (as represented by arrow 108B) is defined as zero degrees, then the angle of the beam emitted from microLED set 102A (as represented by arrow 108A) may defined as −θ and the angle of the beam emitted from microLED set 102C (as represented by arrow 108C) may be defined −θ. It will be recognized that while the absolute values of emission angles and emission profiles (or width) of beams 108A and 108C as illustrated in FIG. 1A are equal, this may be different in other embodiments, depending on the application for which the unit cell is designed. In certain embodiments, the lens 106 is a positive lens and the sets of microLEDs 102 are positioned at or near a focal pane of the lens. The lens 106 may be formed from any material able to adjust beam directionality, including an optical material such as glass or plastic or a Fresnel or other diffraction lens, for example.

Each set of microLEDs 102A-102C is able to emit light of a tunable color and intensity as a function of emission angle and emission profile (or beam width). In particular, the intensity distribution of the light emitted through the lens 106 can be managed by balancing the flux emitted from the sets of microLEDs 102A-102C. By using sufficiently closely spaced microLEDs of varying colors (e.g., RGB) within each set, the intensity distribution of RGB can be managed.

Figure 1B:
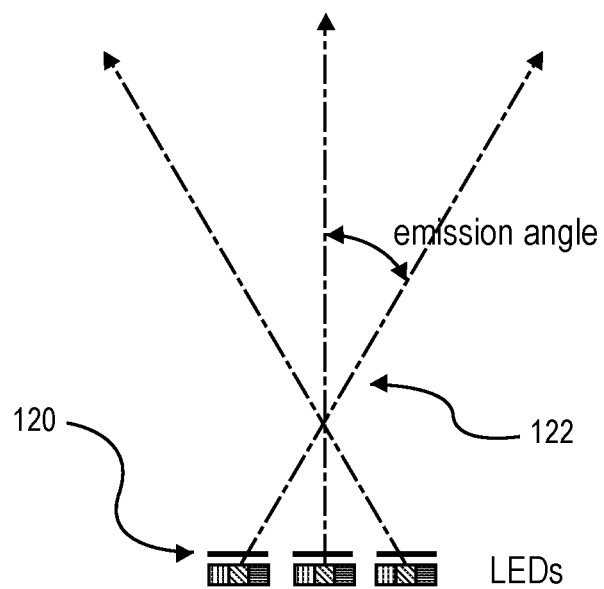
FIGS. 1B-1E respectively illustrate alternative embodiments of a unit cell for representing a pixel in a stereoscopic display implemented using microLEDs in accordance with embodiments described herein.
Figure 1C:
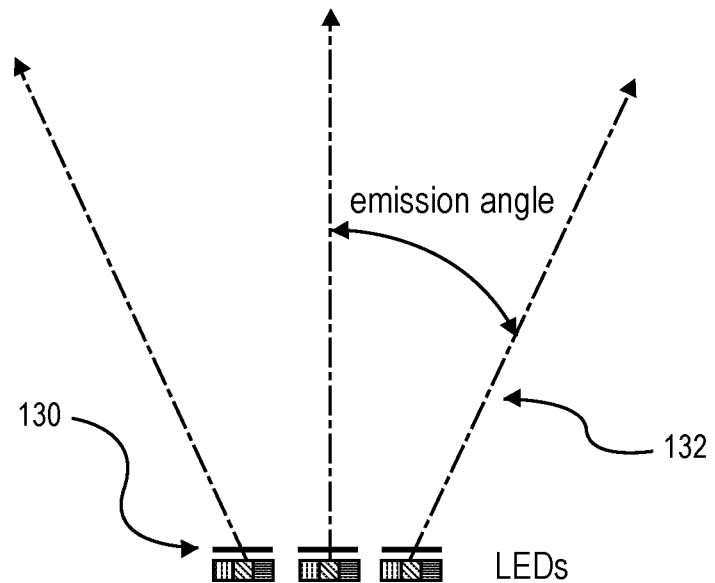
Figure 1D:
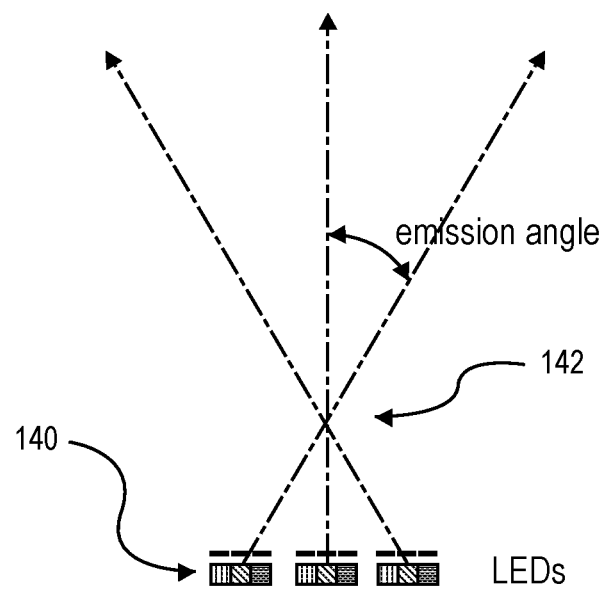
Figure 1E:
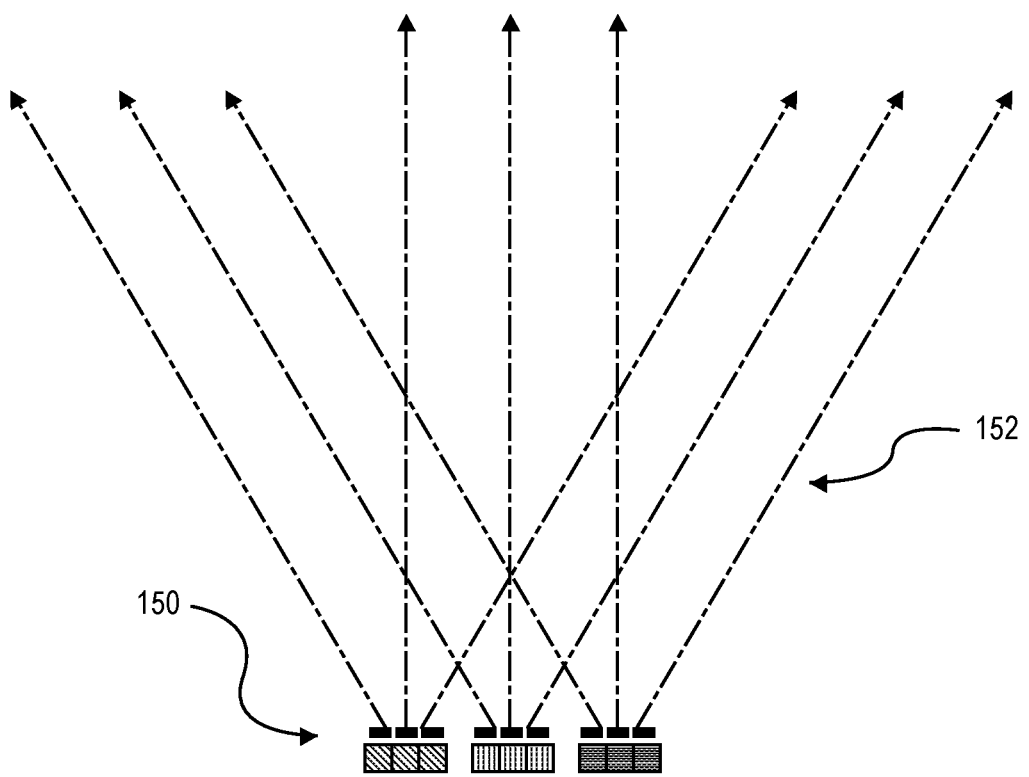

FIGS. 1B-1E respectively illustrate alternative embodiments of a unit cell. In particular, FIG. 1B illustrates a unit cell 120 in which each set of microLEDs has an individual optic (or lens) associated therewith, the unit cell being configured to create an emission pattern 122. Similarly, FIG. 1C illustrates a unit cell 130 in which each set of microLEDs has an individual optic associated therewith, the unit cell being configured to create an alternative emission pattern 132. FIG. 1D illustrates a unit cell 140 in which each individual microLED has an individual optic associated therewith, the unit cell being configured to create an emission pattern 142. Similarly, FIG. 1E illustrates a unit cell 150 in which each individual microLED has an individual optic associated therewith, the unit cell being configured to create an alternative emission pattern 152. It should be noted that, as illustrated in FIG. 1E, the sets of microLEDs may include multiple microLEDs that emit the same color light. Furthermore, each set of microLEDs may include more or fewer than three microLEDs as illustrated throughout the FIGURES. In this case, other color microLEDs may be used within each set, and more than 3 microLEDs of different colors may be used in each set.

It should further be noted that each unit cell (e.g., unit cells 100, 200, 300, 400, and 500) is capable of managing the intensity distribution of the corresponding pixel (or hyperpixel) as a function of emission angles (e.g. longitude and latitude) and emission profiles in addition to the traditional color values (RGB+). This, as described in more detail below, may permit different images to be provided at different viewing angles. In contrast, a traditional pixel emits light with a fixed intensity distribution.

Figure 2:
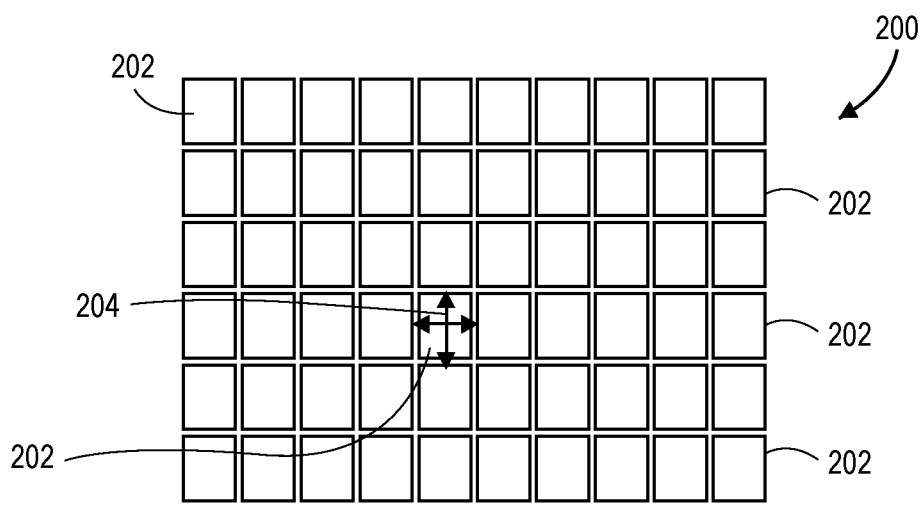
FIG. 2 illustrates a top schematic view of a portion of a stereoscopic microLED display in accordance with embodiments described herein.

Turning now to FIG. 2, illustrated therein is top schematic view of a portion of a stereoscopic microLED display 200 in accordance with embodiments described herein. As shown in FIG. 2, the display 200 includes a plurality of unit cells 202 each of which is associated with and corresponds to a pixel of the display 200. As represented by a pair of arrows 204, light is emitted from each unit cell 202 as determined by its structure (i.e., the number of sets of microLEDs and the positioning of the lens). Stereoscopy, in general, creates the illusion of three-dimensional depth from slightly different two-dimensional images provided to different eyes of a viewer via the display 200 using the interpretation of the images within the brain of the viewer.

Figure 3:
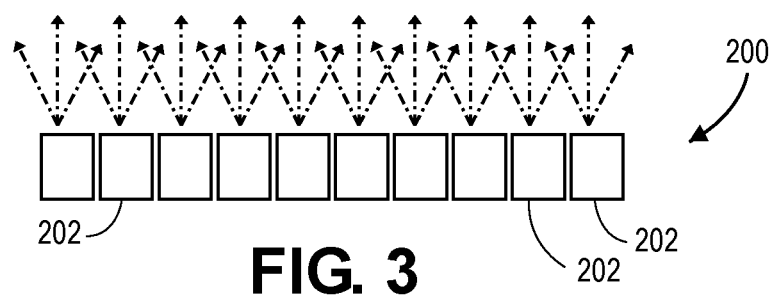
FIG. 3 is a side view of the stereoscopic microLED display shown in FIG. 2.

FIG. 3 is a side view of the display 200 shown in FIG. 2. As shown in FIG. 3, each of the unit cells 202 has an emission pattern similar to that of the unit cell 100 illustrated in FIG. 1A, although as noted above, different emission patterns are anticipated and expected depending on the configuration of the unit cells 202 and application of the display 200. As shown in FIG. 3, each pixel provides an angular emission intensity distribution corresponding to the emission pattern.

Figure 4A:
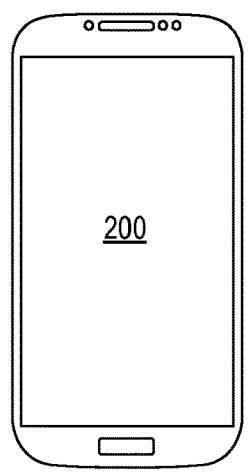
FIGS. 4A-4D illustrate various systems into which a stereoscopic microLED display in accordance with embodiments described herein may be incorporated.
Figure 4B:
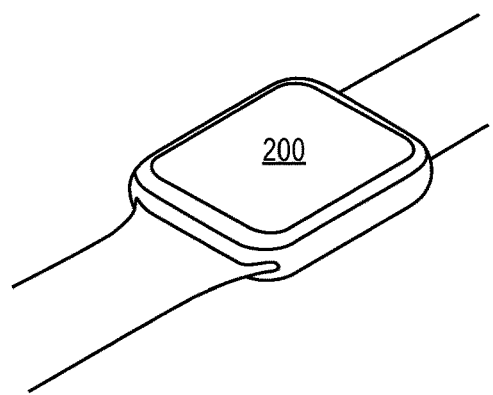
Figure 4C:
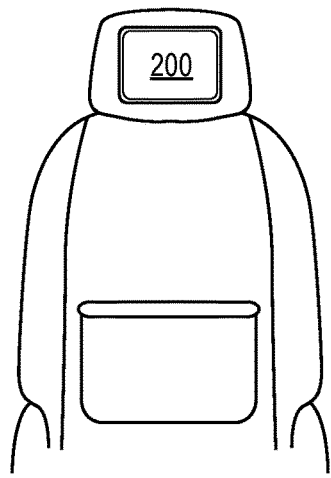
Figure 4D:
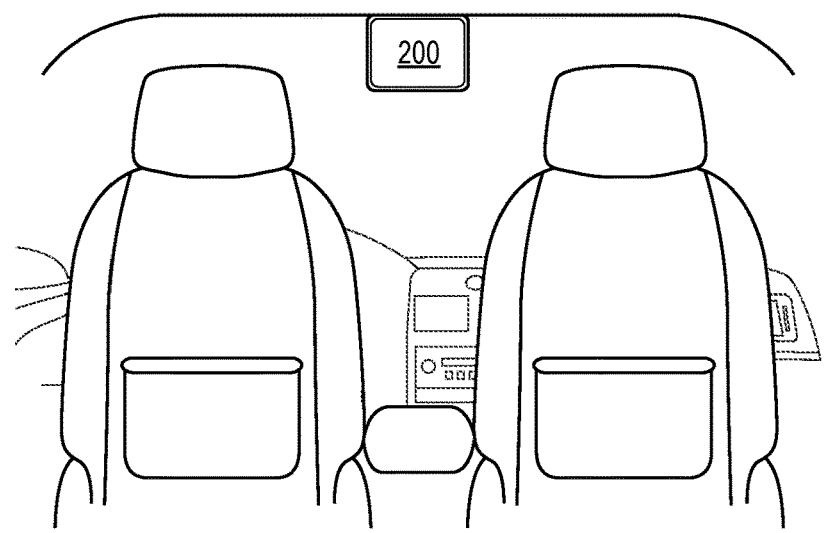

In various embodiments, the display 200 maybe advantageously incorporated into and/or deployed as a display for a variety of systems, devices and/or applications, including but not limited to smartphones (FIG. 4A), smart watches (FIG. 4B), and video display systems for vehicles such as automobiles and aircraft in which the display may hang from the ceiling of the vehicle and/or be incorporated into or otherwise connected to the back of a passenger seat (FIGS.

4C and 4D). Thus, in a vehicle the microLED display can be positioned in one or more locations within the vehicles for interior projection. In some cases, the microLEDs may be switched between interior stereoscopic projection and general illumination of the vehicle interior or some sets of the microLEDs may be used for interior stereoscopic projection and others for illumination of the vehicle interior. Thus, in some cases the microLEDs may be used for illumination in various locations, such as seating and floor areas. The microLEDs may be used for illumination of internal or external features, such as door handles and mirrors, as well as display of electronic gauges and other vehicular or entertainment information. Projection and illumination sources can be located in one or more locations within the vehicle, such as the roof, sides, rear, windows, seats or front (including the dashboard). For general illumination, the microLEDs may be used to outline or accent interior areas or components and or illuminate these areas or occupants. Control of the vehicle interior lighting system may be based on vehicle computer input, such as speed and direction, external input, such as ambient light and/or temperature, and/or user input via a user interface to the illumination source or user input device.

Figure 5:
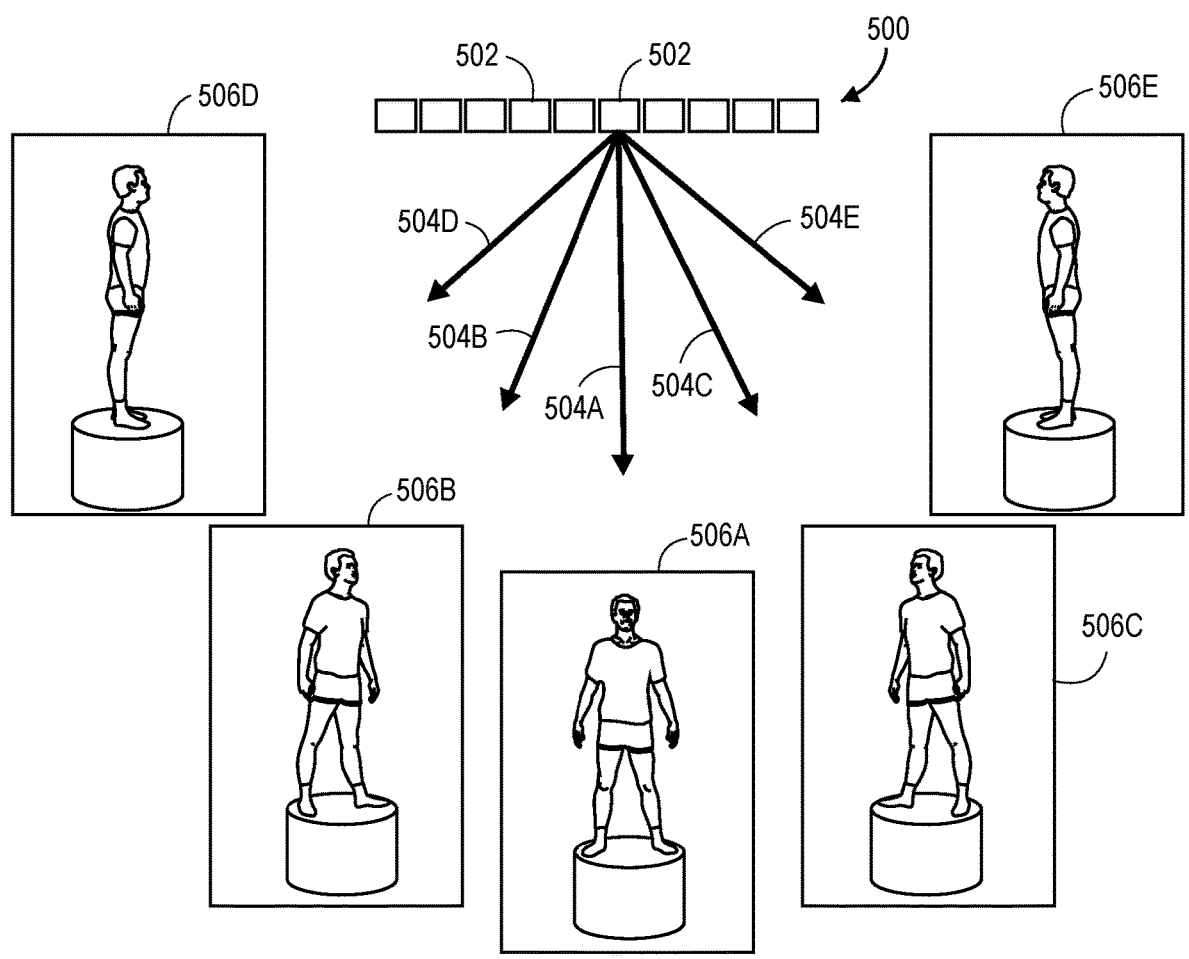
FIG. 5 illustrates operation of a display implemented using microLEDs in accordance with embodiments described herein to generate stereoscopic effects.

FIG. 5 illustrates operation of a display 500 implemented using microLEDs in accordance with embodiments described herein to generate stereoscopic effects. As shown in FIG. 5, the display 500 (shown in side view) includes a number of unit cells 502 each corresponding to and implementing a pixel of the display and having an emission pattern comprising beams represented by arrows 504A-504E. As shown in FIG. 5, multiple views of the same image may be produced, depending on where the viewer is positioned relative to the display 500; that is, depending on the observation angle from the display 500. For example, if a viewer (not shown in FIG. 5) is positioned directly in front of the display 500 (corresponding to a beam 504A and an emission angle of zero), the viewer will see a first view of an image 506A on the display 500. Alternatively, if the viewer is positioned at a viewing, or observation, angle relative to the display corresponding to an emission angle of the beam 504B, the viewer will see the image on the display 500 from a slightly different perspective, as represented by image 506B. Similarly, if the viewer is positioned at a viewing angle relative to the display 500 corresponding to an emission angle of the beam 504C, the viewer will see the image on the display 500 from yet another perspective (this one the opposite of the image 506B), as represented by an image 506C. Still further, if the viewer is positioned at a viewing angle relative to the display 500 corresponding to the emission angle of the beam 504D, the viewer will the image on the display 500 from yet another perspective, as represented by an image 506D. Finally, if the viewer is positioned at a viewing angle relative to the display 500 corresponding to an emission angle of the beam 504E, the viewer will see the image on the display 500 from yet another perspective (this one the opposite of the image 506D), as represented by an image 506E. As illustrated in FIG. 5, in accordance with features of embodiments provided herein, an image presented to/perceived by a viewer may depend on the viewer's position, or viewing angle, relative to the display. Additionally, while the images 506B-506E are shown as discrete versions of the original image 506A, it will be recognized that in certain embodiments, a continuous change in observation angle relative to the display 500 may result in a continuous change in image perspective presented to the viewer.

Figure 6:
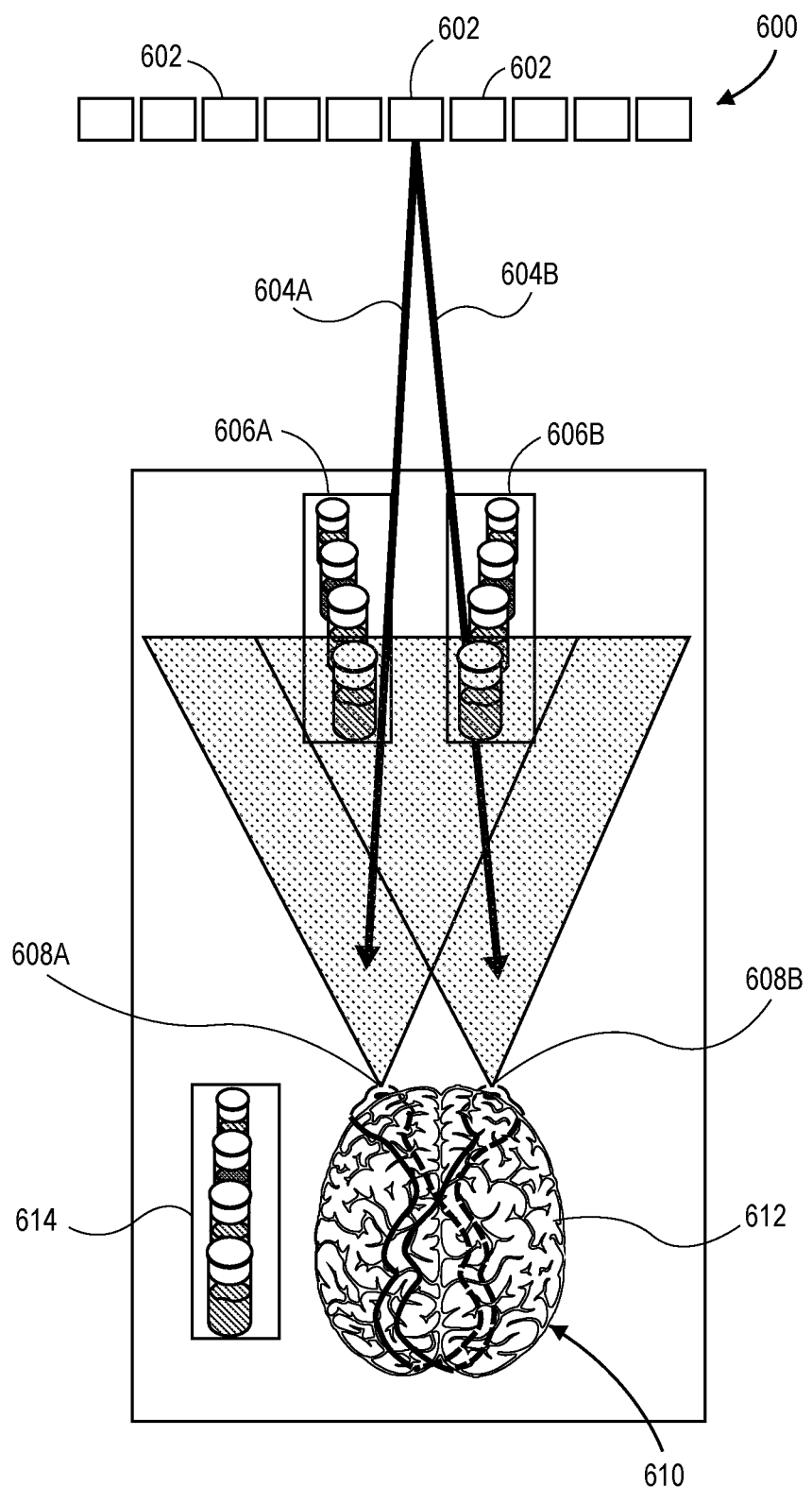
FIG. 6 illustrates operation of a display implemented using microLEDs in accordance with embodiments described herein to effect stereoscopic vision.

Referring now to FIG. 6, illustrated therein is operation of a display 600 implemented using microLEDs in accordance with embodiments described herein to effect stereoscopic vision. As shown in FIG. 6, the display 600 (shown in side view) includes a number of unit cells 602 each corresponding to and implementing a pixel of the display and having an emission pattern comprising beams represented by arrows 604A-604B. Using the concepts described above with reference to FIG. 5, first and second versions of an image, respectively designated in FIG. 6 by reference numerals 606A and 606B, are respectively presented to left and right eyes 608A, 608B, of a viewer 610 via beams 604A, 604B, respectively. The received images 606A, 606B, are combined by the user's brain 612 to create a three-dimensional version 614 of the images.

Figure 7:
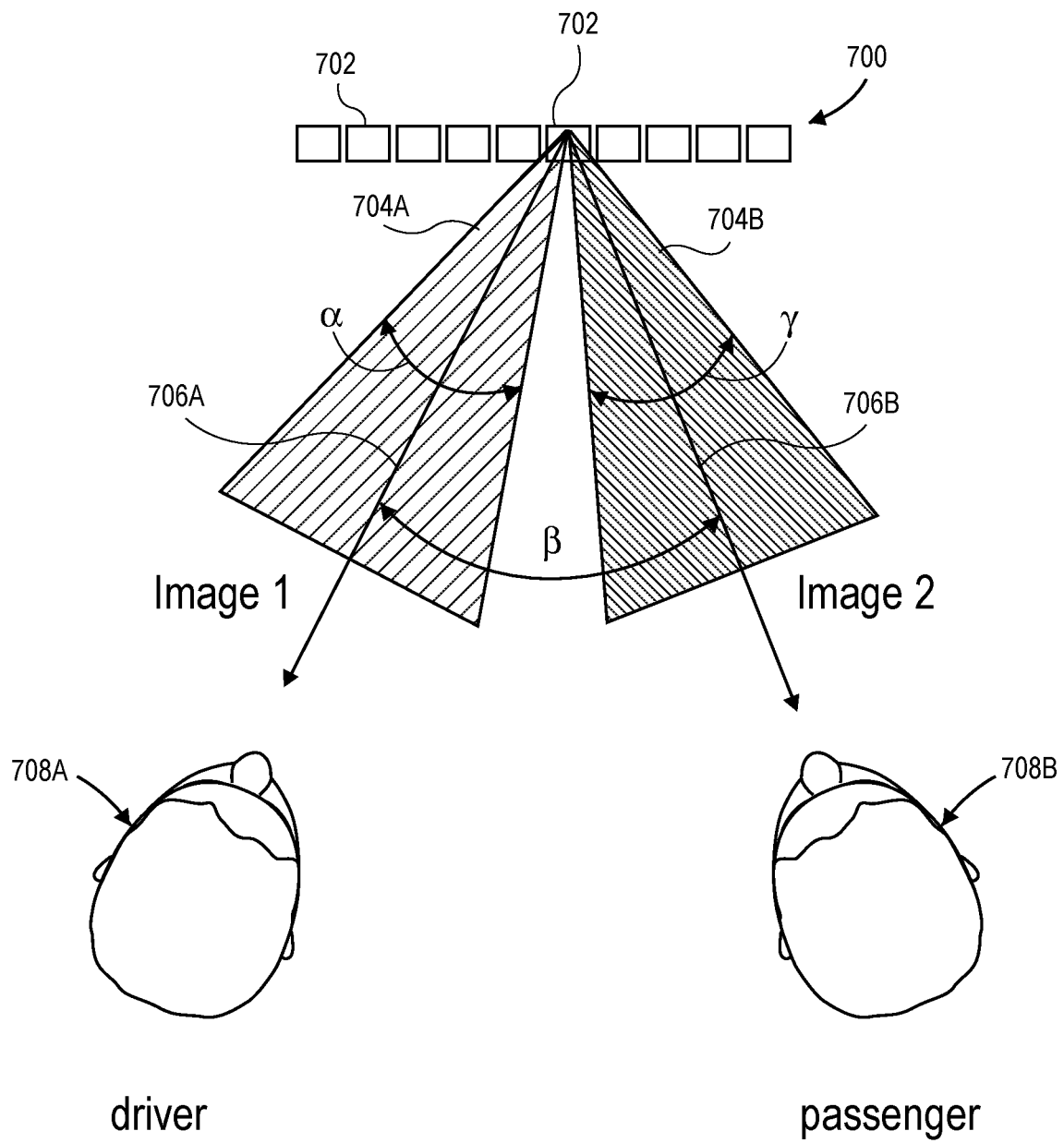
FIG. 7 is a display implemented using microLEDs in accordance with embodiments described herein to implement a multiview display.

FIG. 7 is a display 700 implemented using microLEDs in accordance with embodiments described herein to implement a multiview display. As shown in FIG. 7, the display 700 (shown in side view) includes a number of unit cells 702 each corresponding to and implementing a pixel of the display. As shown in FIG. 7, each unit cell 702 effectively has two emission patterns 704A and 704B. Emission pattern 704A is centered at a line of sight, represented by an arrow 706A, of a first viewer 708A and emission pattern 704B is centered at a line of sight, represented by an arrow 706B, of a second viewer 708B. As illustrated in FIG. 7, an angle the line of sight 706A of the first viewer 708A and the line of sight 706B of the second viewer 708B is given by $\beta$. In certain embodiments, assuming angle $\beta$ is greater than half the angle of the emission pattern 704A (given by $\alpha$) plus half the angle of the emission pattern 704B (given by $\gamma$), then two images (or videos) may be presented to the first viewer 708A and second viewer 708B via the panel 700 by controlling the color and intensity of the microLEDs (not shown) comprising the unit cells 702.

Figure 8:
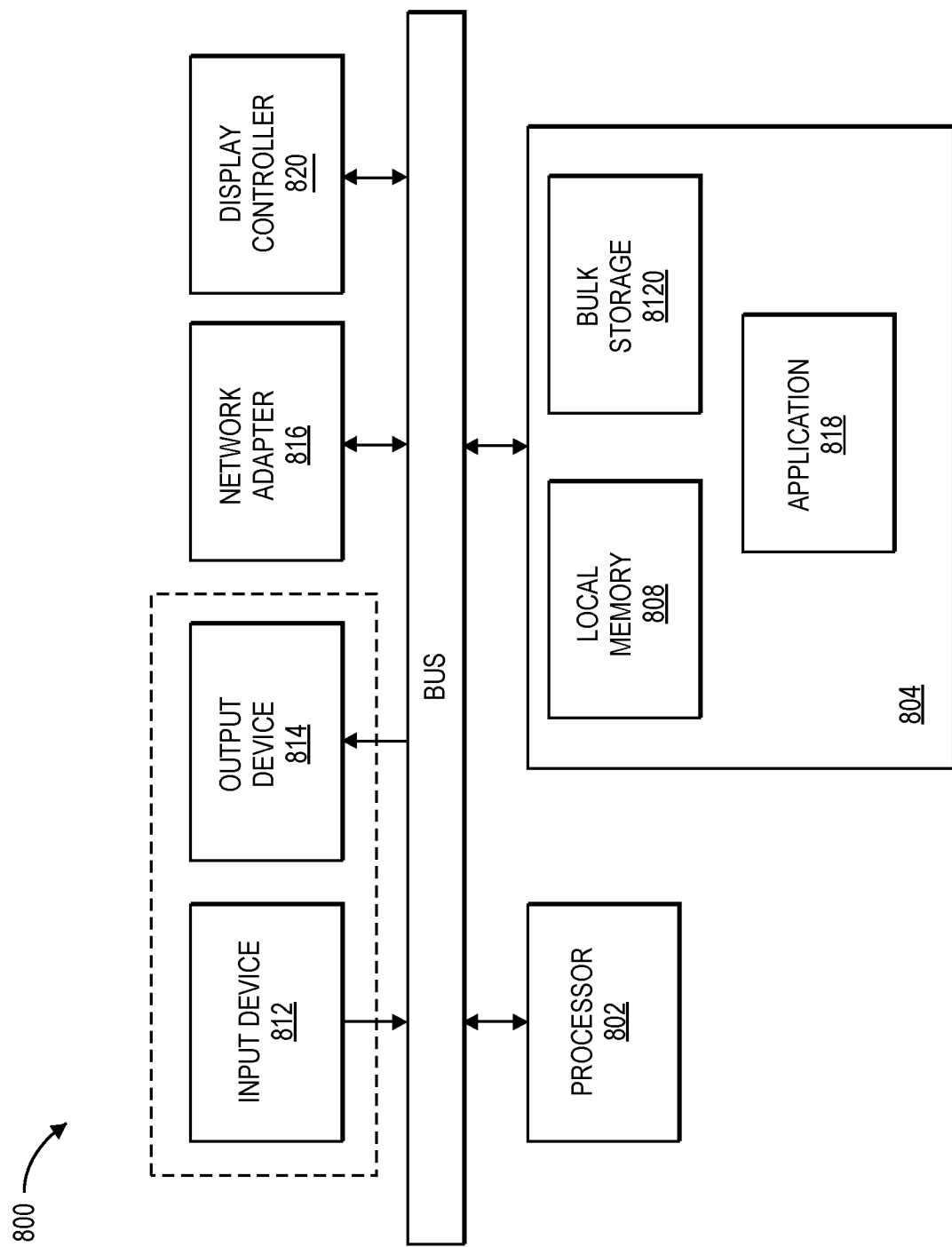
FIG. 8 is a block diagram illustrating an example data processing system that may be configured to implement at least portions of a display implemented using microLEDs in accordance with embodiments described herein.

FIG. 8 is a block diagram illustrating an example data processing system 800 that may be configured to implement at least portions of a display implemented using microLEDs in accordance with embodiments described herein, and more particularly as shown in the FIGURES described hereinabove.

As shown in FIG. 8, the data processing system 800 may include at least one processor 802, e.g. a hardware processor 802, coupled to memory elements 804 through a system bus 806. As such, the data processing system may store program code within memory elements 804. Further, the processor 802 may execute the program code accessed from the memory elements 804 via a system bus 806. In one aspect, the data processing system may be implemented as a computer that is suitable for storing and/or executing program code. It should be appreciated, however, that the data processing system 800 may be implemented in the form of any system including a processor and a memory that is capable of performing the functions described within this disclosure, such as a smart phone, a smart watch, or a video display system, for example.

In some embodiments, the processor 802 can execute software or an algorithm to perform the activities as discussed in this specification, in particular activities related to a display implemented using microLEDs in accordance with embodiments described herein. The processor 802 may include any combination of hardware, software, or firmware providing programmable logic, including by way of non-limiting example a microprocessor, a DSP, a field-programmable gate array (FPGA), a programmable logic array (PLA), an integrated circuit (IC), an application specific IC (ASIC), or a virtual machine processor. The processor 802 may be communicatively coupled to the memory element 804, for example in a direct-memory access (DMA) configuration, so that the processor 802 may read from or write to the memory elements 804.

In general, the memory elements 804 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 800 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 1-7, can also include suitable interfaces for receiving, transmitting, and/or otherwise communicating data or information in a network environment so that they can communicate with, e.g., the data processing system 800 of another one of these elements.

In certain example implementations, mechanisms for implementing a display implemented using microLEDs as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 804 shown in FIG. 8, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 802 shown in FIG. 8, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 804 may include one or more physical memory devices such as, for example, local memory 808 and one or more bulk storage devices 810. The local memory may refer to RAM or other non-persistent memory device(s) generally used during actual execution of the program code. A bulk storage device may be implemented as a hard drive or other persistent data storage device. The processing system 800 may also include one or more cache memories (not shown) that provide temporary storage of at least some program code in order to reduce the number of times program code must be retrieved from the bulk storage device 810 during execution.

As shown in FIG. 8, the memory elements 804 may store an application 818. In various embodiments, the application 818 may be stored in the local memory 808, the one or more bulk storage devices 810, or apart from the local memory and the bulk storage devices. It should be appreciated that the data processing system 800 may further execute an operating system (not shown in FIG. 8) that can facilitate execution of the application 818. The application 818, being implemented in the form of executable program code, can be executed by the data processing system 800, e.g., by the processor 802. Responsive to executing the application, the data processing system 800 may be configured to perform one or more operations or method steps described herein.

Input/output (I/O) devices depicted as an input device 812 and an output device 814, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In particular, the output device 814 includes features of one or more embodiments of a display implemented using microLEDs in accordance with embodiments described herein. In some implementations, the system may include a driver (not shown) for the output device 814. Input and/or output devices 812, 814 may be coupled to the data processing system either directly or through intervening I/O controllers.

In an embodiment, the input and the output devices may be implemented as a combined input/output device (illustrated in FIG. 8 with a dashed line surrounding the input device 812 and the output device 814). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 816 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 800, and a data transmitter for transmitting data from the data processing system 800 to said systems, devices and/or networks. Modems, cable modems, and Ethernet cards are examples of different types of network adapter that may be used with the data processing system 800. A display controller 820 may also be provided for purposes described hereinbelow.

The network adapter 816 may communicate over a communications network or directly utilizing any one or more of a number of wireless local area network (WLAN) transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.16 family of standards known as WiMax, IEEE 802.15.4 family of standards, a Long Term Evolution (LTE) family of standards, a Universal Mobile Telecommunications System (UMTS) family of standards, peer-to-peer (P2P) networks, next generation (NG)/5$^{th}$ generation (5G) standards, Zigbee, or Bluetooth, among others.

Figure 9:
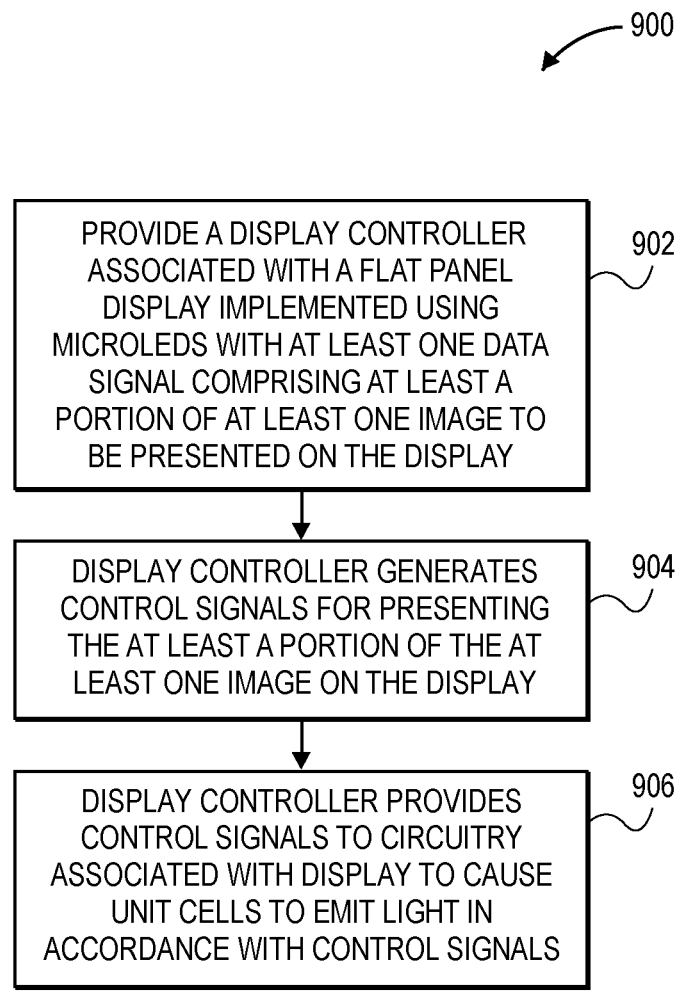
FIG. 9 is a flow chart illustrating operation of a display implemented using microLEDs in accordance with embodiments described herein.

FIG. 9 provides a flow chart of a method 900 for operating a display implemented using microLEDs according to some embodiments of the present disclosure. At least portions of the method 900 may be implemented by elements according to any embodiment of the present disclosure, e.g., by a display implemented using microLEDs in accordance with embodiments described with reference to FIGS. 1-7 or/and by one or more data processing systems, such as the data processing system 800 shown in FIG. 8. Although described with reference to system components of the systems shown in the present figures, any system, configured to perform operations of the method 900, in any order, is within the scope of the present disclosure.

Referring to FIG. 9, in step 902, display controller associated with a display implemented using microLEDs according to some embodiments (e.g., displays 200, 500, 600 and/or 700), wherein each of the unit cells of the display has a particular emission pattern in accordance with a configuration thereof, is provided with at least one data signal comprising at least a portion of at least one image to be presented on the display. In step 904, the display controller (e.g., display controller 820) determines control signals for presenting the at least one data signal on the display. In particular, the display controller determines an intensity and color to be emitted by each of the unit cells of the display in accordance with an emission pattern of the unit cells. In step 906, the display controller provides the control signals to circuitry associated with the unit cells to cause the unit cell to emit one or more beams in accordance with the determined intensity and color. In some embodiments, the control signals from the display controller will cause the display to present stereoscopic images, as illustrated in FIG. 6. In other embodiments, the display controller may cause the display to present two or more different images the perception of which is dictated by an observation angle of a viewer, as illustrated in FIG. 7.

Figure 10:
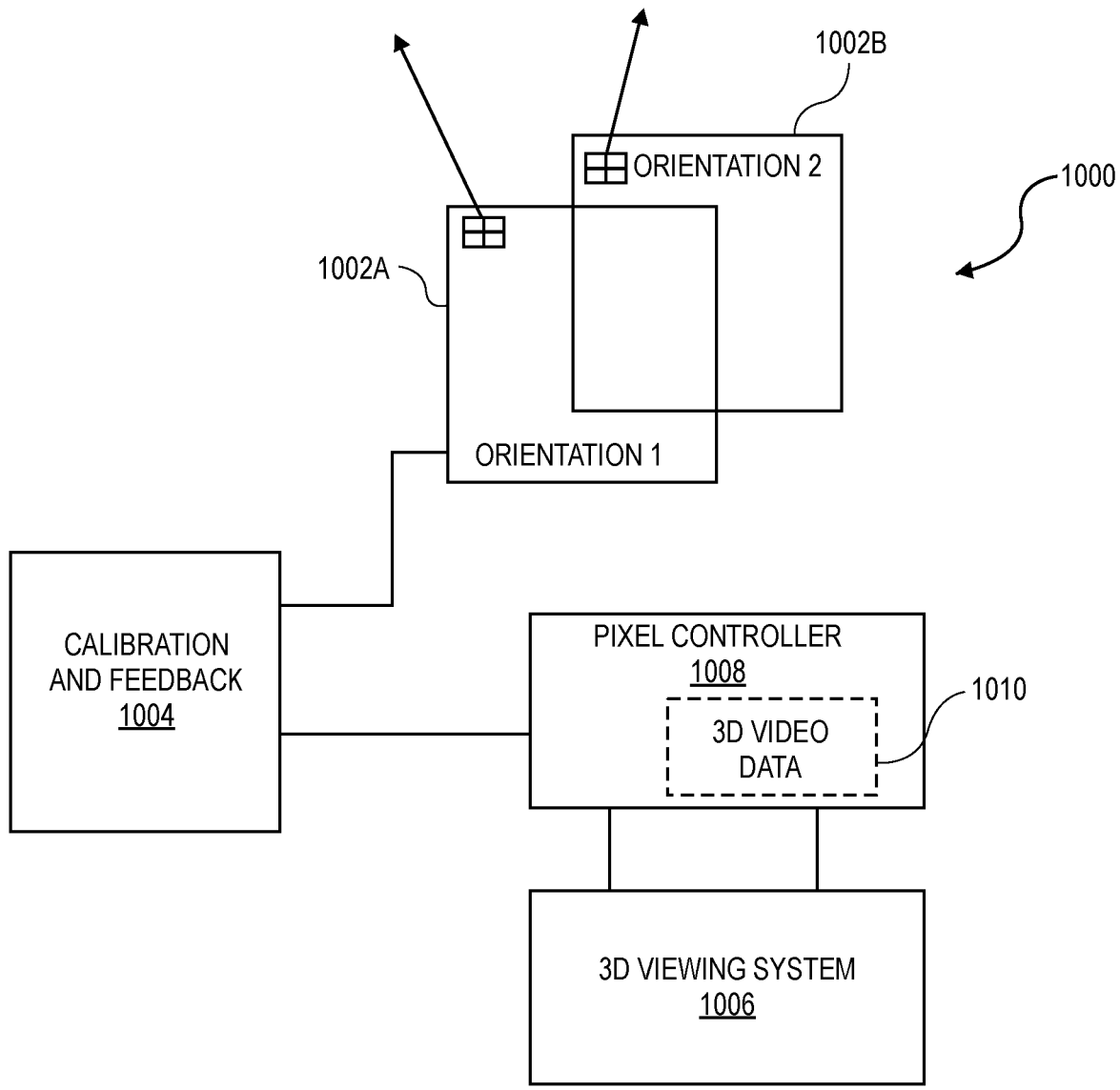
FIG. 10 is another block diagram illustrating an example system for implementing at least portions of a display implemented using microLEDs in accordance with embodiments described herein.

FIG. 10 is another block diagram illustrating a microLED display system 1000 in accordance with embodiments described herein. As shown in FIG. 10, the display system may present one or more images in multiple orientations, represented in FIG. 10 by orientations 1002A and 1002B. The system 1000 may further include a calibration and feedback module 1004 for calibrating the system 1000, a 3D viewing system 1006 for generating 3D images, and a pixel controller 1008 having access to 3D image or video data 1010 for presentation on a display. In some embodiments, image or other data can be stored in an image frame buffer. If no changes in image data are to be made, one or more standby images can be directed to the image frame buffer. Such standby images can include, for example, an intensity and spatial pattern used for baseline or standard display or light projection. In operation, pixels in the images are used to define response of corresponding microLED pixels, with intensity and spatial modulation of microLED pixels being based on the image(s). In addition to the modules described in relation to FIG. 10, the modules of the data processing system of FIG. 8 may be present. For example, the network adaptor of FIG. 8 used in the system 1000 may be used for a smart watch to communicate with a paired smart phone via WiFi, while the network adaptor may allow the smart watch to communicate with the network using a 5G protocol.

To reduce data rate issues, groups of pixels or hyperpixels (e.g., square blocks of Y×Y pixels) can be controlled as single blocks in some embodiments. The blocks may be used, for example 3×3, 5×5, 7×7, or other sizes. High speed and high data rate operation can be supported, with pixel values from successive images able to be loaded as successive frames in an image sequence at a rate between 24 Hz and 100 Hz, with 60 Hz being typical. Each microLED hyperpixel can be operated to emit light in a pattern and with an intensity at least partially dependent on the image held in the image frame buffer. Pulse width modulation can be used to control each pixel to emit light in a pattern and with an intensity at least partially dependent on the image.

Applications supported by the microLED pixels include both augmented reality (AR) and virtual reality (VR). Various types of devices may be used to provide AR/VR to users, including headsets, glasses, and projectors. Such an AR/VR system may have a microLED array containing the microLED pixels, an AR or VR display (e.g., a headset or glasses), a microLED array controller, sensors, and a system controller. The AR/VR system components can be disposed in a single structure, or one or more of the components shown can be mounted separately. For example, a first set of components, the microLED array, AR or VR display, and sensors can be mounted on a single device, such as those above, while a second set of components, the microLED array controller and/or system controller, may be disposed separately from the first set of components and connected via wireless communication.

User data input provided to the system controller can include information provided by audio instructions, haptic feedback, eye or pupil positioning, or connected keyboard, mouse, or game controller. The system controller controls the microLED array controller based on signals from the sensors. The sensors may include cameras, depth sensors, audio sensors, accelerometers, two or three axis gyroscopes and other types of motion and/or environmental/wearer sensors. The sensors may also be configured to receive a control input. Other sensors can include air pressure, stress sensors, temperature sensors, or any other suitable sensors needed for local or remote environmental monitoring. In some embodiments, the control input can include detected touch or taps, gestural input, or control based on headset or display position. As another example, based on the one or more measurement signals from one or more gyroscope or position sensors that measure translation or rotational movement, an estimated position of the AR/VR system relative to an initial position can be determined. Thus, movement of the person (or head) can be detected and the image displayed can be changed accordingly.

As above, the microLED array can support hundreds, thousands, or even millions of microLEDs positioned together on centimeter scale area substrates or smaller. The microLED array can be monochromatic, RGB, or other desired chromaticity. The pixels of the microLED array can be square, rectangular, hexagonal, or have curved perimeter. Pixels can be of the same size, of differing sizes, or similarly sized and grouped to present larger effective pixel size and controlled via a Complementary Metal Oxide Semiconductor (CMOS) backplane, for example. In some embodiments, separate microLED arrays can be used to provide display images, with AR features being provided by a distinct and separate microLED array.

In some embodiments, the microLED array controller may control one group of pixels to be used for displaying content (AR/VR and/or non-AR/VR) to the user while controlling another group of pixels to be used as tracking pixels for providing tracking light used in eye tracking to adjust the content. Content display pixels are designed to emit light within the visible band (approximately 400 nm to 780 nm). Tracking pixels may be designed to emit visible light and/or light in the IR band (approximately 780 nm to 2,200 nm). In some embodiments, the tracking pixels and content pixels may be simultaneously active. In some embodiments, the tracking pixels may be controlled to emit tracking light during a time period that content pixels are deactivated and are thus not displaying content to the user. The microLED array controller may control the image displayed based on the x, y, z position of the viewer as determined by the system controller (using sensor data and perhaps user input data) and indicated to the microLED array controller.

In some embodiments, the microLED pixels and circuitry supporting microLED array can be packaged and include a submount or printed circuit board for powering and controlling light production by the microLEDs. The printed circuit board supporting the microLED array may include electrical vias, heat sinks, ground planes, electrical traces, and flip chip or other mounting systems. The submount or printed circuit board may be formed of any suitable material, such as ceramic, silicon, aluminum, etc. If the submount material is conductive, an insulating layer may be formed over the substrate material, and a metal electrode pattern formed over the insulating layer for contact with the microLED array. The submount can act as a mechanical support, providing an electrical interface between electrodes on the microLED array and a power supply, and also provide heat sink functionality.

The AR/VR system can incorporate lens as described above in the microLED array and/or AR/VR display to couple light emitted by microLED array into the AR/VR display. Each lens can have at least one coating, such as a UV blocking or anti-reflective coating. In some embodiments, the lenses may be designed to polarize the light transmitted therethrough. The lenses in other embodiments include one an aperture and/or filter. The lenses, instead of directing light from the microLEDs, as described above, can be used to magnify and/or correct images, such as correction or minimization of various two- or three-dimensional optical errors.

In one embodiment, the microLED array controller may provide power and real time control for the light emitting array. For example, the microLED array controller may implement individual pixel-level or group pixel-level control of amplitude and duty cycle. The microLED array controller may contain a frame buffer for holding generated or processed images that can be supplied to the microLED array. The microLED array controller and/or system controller may include digital control interfaces such as an Inter-Integrated Circuit serial bus, Serial Peripheral Interface (SPI), USB-C, HDMI, Display Port, or other suitable image or control modules that are configured to transmit image data, control data or instructions.

In some embodiments, the system controller may use data from the sensors to integrate measurement signals received from the accelerometers over time to estimate a velocity vector and integrate the velocity vector over time to determine an estimated position of a reference point for the AR/VR system. The system controller may also provide an initial calibration mentioned above. In other embodiments, the reference point used to describe the position of the AR/VR system can be based on depth sensor, camera positioning views, or optical field flow. Based on changes in position, orientation, or movement of the AR/VR system, the system controller can send images or instructions the light emitting array controller. Changes or modification the images or instructions can also be made by user data input, or automated data input.

In one embodiment, intensity can be separately controlled and adjusted by setting appropriate ramp times and pulse width for each microLED pixel using a logic and control module and the pulse width modulation module. This allows staging of LED pixel activation to reduce power fluctuations, and to provide various pixel diagnostic and calibration functionality.

It should be noted that, although the displays illustrated herein are shown as being rectangular and flat, the techniques described herein for implementing a display using microLED technology are not so limited and may be used to implement non-rectangular and/or curved displays as desired.

Other than display applications, various applications can be supported by microLED pixel or hyperpixel array systems such as described herein. Light emitting pixel arrays may support any applications that benefit from fine-grained intensity, spatial, and temporal control of light distribution. This may include, but is not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated optics may be distinct at a pixel, pixel block, or device level. An example light emitting pixel array may include a device having a commonly controlled central block of high intensity pixels with an associated common optic, whereas edge pixels may have individual optics. Common applications supported by light emitting pixel arrays include video lighting, automotive headlights, architectural and area illumination, street lighting, and informational displays.

Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various streetlight types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions.

Light emitting arrays are also well suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided.

Vehicle headlamps are a light emitting array application that requires large pixel numbers and a high data refresh rate and thus can also benefit from the use of microLED arrays. Automotive headlights that actively illuminate only selected sections of a roadway can used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

In some embodiments, the microLED arrays may be used in flash modules for cell phones or other electronic devices. A controller similar to the above may be used to control each microLED array, microLED unit cell, or microLED independently based on user input (direct or wireless) or ambient lighting conditions in a manner similar to the above. When used in a camera flash, the microLED array dimensions may correspond to the aspect ratio of the camera's field of view. The controller may control the microLED arrangement (microLED array, one or more microLED unit cells, or one or more individual microLEDs) to operate in response to the above signals and/or sensed ambient conditions. The controller may be thus connected with the microLED array, one or more user input devices (e.g., a button), transceiver (for wireless input) and/or one or more sensors, among others via circuitry (e.g., LED drivers and other control circuitry) similar to the above embodiments. The microLED array may emit visible or IR light and may be interspersed with, or be separate from, a photodiode array to detect ambient visible or IR light, which also may be the case in other embodiments above. The controller may be on the same circuit board as the microLED array or may be disposed on a different circuit board. The controller may determine the appropriate luminescent conditions (e.g., colors to be activated for the microLED arrangement and intensity) and activate the appropriate portion or all of the microLED arrangement using pulse width modulation signals to the microLED arrangement It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

It should be appreciated that the electrical circuits of the accompanying drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In some embodiments, any number of electrical circuits of the accompanying drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the accompanying drawings may be implemented as stand-alone modules (e.g., a device with associated components and circuitry configured to perform a specific application or function) or implemented as plug-in modules into application specific hardware of electronic devices. Note that some embodiments of the present disclosure may be readily included in a system on chip (SOC) package, either in part, or in whole. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, features may be implemented in one or more silicon cores in Application Specific Integrated Circuits (ASICs), Field Programmable Gate Arrays (FPGAs), and other semiconductor chips.

It is also important to note that the functions related to embodiments described herein include only some of the possible functions that may be executed by, or within, the systems described herein. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of any of the devices and systems described herein may also be implemented with respect to the methods or processes described herein and specifics in the examples may be used anywhere in one or more embodiments.

The invention claimed is:

1. A non-transitory computer-readable storage medium that stores instructions for execution by one or more processors of an electronic apparatus, the one or more processors to configure the electronic apparatus to, when the instructions are executed, perform operations comprising:
controlling each set of a plurality of sets of microLEDs to operate in a mode selectable from a set of modes that includes a stereoscopic projection mode to provide a stereoscopic image and a general illumination mode to provide general lighting of an area without providing any images to the area; and
in the stereoscopic projection mode implemented by at least some of the plurality of sets of microLEDs:
receiving at least one video data signal; and
in response to the at least one video data signal, simultaneously producing a first emission profile from a first subset of the at least some of the plurality of sets of microLEDs and a second emission profile from a second subset of the at least some of the plurality of sets of microLEDs and directing the first emission profile toward a first emission angle to form a first image of a scene and the second emission profile toward a second emission angle to form a second image of the scene, the first image and the second image corresponding to different viewing angles of the scene to form a three-dimensional stereoscopic image, the second subset of the at least some of the plurality of sets of microLEDs being different from the first subset of the at least some of the plurality of sets of microLEDs.

2. The medium of claim 1, wherein a single lens is positioned over the plurality of sets of microLEDs.

3. The medium of claim 1, wherein a plurality of lenses is disposed such that a different lens is positioned over each set of microLEDs of the plurality of sets of microLEDs.

4. The medium of claim 1, wherein a plurality of lenses is disposed such that a different lens is positioned over each microLED in each set of microLEDs of the plurality of sets of microLEDs.

5. The medium of claim 1, wherein:
the electronic apparatus is disposed in a vehicle, and
the one or more processors configure the electronic apparatus, when the instructions are executed, to use at least one set of the plurality of sets of microLEDs to:
illuminate at least a portion of an interior of the vehicle in the general illumination mode, and
provide the first image and the second image of the scene within at least a section of the interior of the vehicle in the stereoscopic projection mode.

6. The medium of claim 5, wherein the one or more processors configure the electronic apparatus to, when the instructions are executed, use the at least one set of microLEDs in the general illumination mode to outline or accent specific interior areas.

7. The medium of claim 5, wherein the one or more processors configure the electronic apparatus to, when the instructions are executed, use the at least one set of microLEDs in the general illumination mode to illuminate at least one area including specific interior areas and an area in which occupants are located in the general illumination mode.

8. The medium of claim 5, wherein the one or more processors configure the electronic apparatus to, when the instructions are executed, control the at least one set of microLEDs in the general illumination mode based on vehicle dynamics that include at least one item including items of speed and direction.

9. The medium of claim 5, wherein the one or more processors configure the electronic apparatus to, when the instructions are executed, control the at least one set of microLEDs in the general illumination mode based on environmental characteristics that include at least one of ambient light and temperature.

10. The medium of claim 5, wherein the plurality of sets of microLEDs are disposed at multiple discrete locations within the vehicle.

11. The medium of claim 1, wherein:
the electronic apparatus is disposed in a vehicle, and
the one or more processors configure the electronic apparatus, when the instructions are executed, to use at least one set of microLEDs to illuminate an exterior of the vehicle in the general illumination mode.

12. The medium of claim 1, wherein the one or more processors configure the electronic apparatus to, when the instructions are executed, simultaneously operate a first set of the microLEDs in the stereoscopic projection mode and a second set of the microLEDs in the general illumination mode.

13. The medium of claim 1, wherein:
the electronic apparatus is disposed in a vehicle, and
the plurality of sets of microLEDs are disposed at multiple discrete locations within the vehicle, and
the multiple discrete locations include a ceiling of the vehicle and a back of at least one seat within the vehicle.

14. An electronic apparatus comprising:
a plurality of sets of microLEDs; and
a controller configured to:
control each set of a plurality of sets of microLEDs to operate in a mode selectable from a set of modes that includes a stereoscopic projection mode to provide a stereoscopic image and a general illumination mode to provide general lighting of an area without providing any images to the area; and
in the stereoscopic projection mode:
receive at least one video data signal; and
in response to the at least one video data signal, independently select, from a set of states that include activated, deactivated, and dimmed, a state of each of the microLEDs in each of the plurality of sets of microLEDs to simultaneously produce a first emission profile from a first subset of the at least some of the plurality of sets of microLEDs and a second emission profile from a second subset of the at least some of the plurality of sets of microLEDs and directing the first emission profile toward a first emission angle to form a first image of a scene and the second emission profile toward a second emission angle to form a second image of the scene, the first image and the second image corresponding to different viewing angles of the scene to form a three-dimensional stereoscopic image, the second subset of the at least some of the plurality of sets of microLEDs being different from the first subset of the at least some of the plurality of sets of microLEDs.

15. The electronic apparatus of claim 14, wherein:
the electronic apparatus is disposed in a vehicle, and
the controller is further configured to use at least one set of the plurality of sets of microLEDs to:

illuminate at least a portion of an interior of the vehicle in the general illumination mode, and provide the first image and the second image of the scene within at least a section of the interior of the vehicle in the stereoscopic projection mode.

16. The electronic apparatus of claim 15, wherein the controller is further configured to use the at least one set of microLEDs in the general illumination mode to outline or accent specific interior areas.

17. The electronic apparatus of claim 15, wherein the controller is further configured to control the at least one set of microLEDs in the general illumination mode based on vehicle dynamics that include at least one item including items of speed and direction.

18. The electronic apparatus of claim 15, wherein the controller is further configured to control the at least one set of microLEDs in the general illumination mode based on environmental characteristics that include at least one of ambient light and temperature.

19. The electronic apparatus of claim 15, wherein the plurality of sets of microLEDs are disposed at multiple discrete locations within the vehicle.

20. The electronic apparatus of claim 14, wherein:
the electronic apparatus is disposed in a vehicle, and
the controller is further configured to use at least one set of microLEDs to illuminate an exterior of the vehicle in the general illumination mode.

21. The electronic apparatus of claim 14, wherein the controller is further configured to simultaneously operate a first set of the microLEDs in the stereoscopic projection mode and a second set of the microLEDs in the general illumination mode.

22. The electronic apparatus of claim 14, wherein:
the plurality of sets of microLEDs is disposed in a configuration selected from a single monolithic array and a plurality of arrays, and the controller is further configured to independently control the plurality of sets of microLEDs for a single monolithic array and control sets of microLEDs of each of the plurality of arrays independently for a plurality of arrays.

23. A method of producing illumination, the method comprising:
controlling each set of a plurality of sets of microLEDs to operate in a mode selectable from a set of modes that includes a stereoscopic projection mode to provide a stereoscopic image and a general illumination mode to provide general lighting of an area without providing any images to the area; and
in the stereoscopic projection mode:
receiving at least one video data signal; and
in response to the at least one video data signal, independently selecting, from a set of states that include activated, deactivated, and dimmed, a state of each of the microLEDs in each of the plurality of sets of microLEDs to simultaneously produce a first emission profile from a first subset of the at least some of the plurality of sets of microLEDs and a second emission profile from a second subset of the at least some of the plurality of sets of microLEDs and directing the first emission profile toward a first emission angle to form a first image of a scene and the second emission profile toward a second emission angle to form a second image of the scene, the first image and the second image corresponding to different viewing angles of the scene to form a three-dimensional stereoscopic image, the second subset of the at least some of the plurality of sets of microLEDs being different from the first subset of the at least some of the plurality of sets of microLEDs.

24. The method of claim 23, wherein:
at least some of the plurality of sets of microLED are disposed in a vehicle, and
the method further comprises using at least one set of microLEDs to illuminate an exterior of the vehicle in the general illumination mode.

* * * * *